US008884625B2

(12) United States Patent
Moon

(10) Patent No.: US 8,884,625 B2
(45) Date of Patent: Nov. 11, 2014

(54) METHOD OF CALCULATING A USED TIME OF A LIGHT SOURCE, METHOD OF DISPLAYING LIFETIME OF A LIGHT SOURCE USING THE METHOD AND DISPLAY APPARATUS FOR PERFORMING THE METHOD

(75) Inventor: Su-Mi Moon, Suwon-si (KR)

(73) Assignee: Samsung Display Co., Ltd. (KR)

( * ) Notice: Subject to any disclaimer, the term of this patent is extended or adjusted under 35 U.S.C. 154(b) by 617 days.

(21) Appl. No.: 12/907,817

(22) Filed: Oct. 19, 2010

(65) Prior Publication Data

US 2011/0095764 A1 Apr. 28, 2011

(30) Foreign Application Priority Data

Oct. 26, 2009 (KR) ........................ 10-2009-0101645

(51) Int. Cl.

| | |
|---|---|
| ***G01R 31/00*** | (2006.01) |
| ***G09G 3/34*** | (2006.01) |
| ***H05B 33/08*** | (2006.01) |

(52) U.S. Cl.

CPC .......... *G09G 3/3406* (2013.01); *H05B 33/0893* (2013.01); *G09G 2330/12* (2013.01); *G09G 2360/145* (2013.01)

USPC .............................. 324/403; 702/72; 702/176

(58) Field of Classification Search

CPC ........ G01R 31/00; G01R 31/02; G01R 31/24; G01R 31/28; G01R 31/2829; G01R 31/025; G01R 31/245; G09G 3/006; G09G 2300/0842

USPC ......... 324/403, 315, 537, 765, 770, 535, 606; 702/72, 176

See application file for complete search history.

(56) References Cited

U.S. PATENT DOCUMENTS

| | | | | |
|---|---|---|---|---|
| 4,831,564 | A * | 5/1989 | Suga | 702/34 |
| 6,819,062 | B2 | 11/2004 | Suzuki | |
| 6,836,260 | B2 | 12/2004 | Cok | |
| 7,053,874 | B2 * | 5/2006 | Koyama | 345/82 |
| 7,332,879 | B2 * | 2/2008 | Kung et al. | 315/307 |
| 7,518,321 | B2 | 4/2009 | Chang et al. | |
| 7,808,757 | B2 * | 10/2010 | Guillott et al. | 361/93.1 |
| 8,301,399 | B2 * | 10/2012 | Ohgoh | 702/34 |

(Continued)

FOREIGN PATENT DOCUMENTS

| | | |
|---|---|---|
| JP | 2002-287243 | 10/2002 |
| JP | 2007-172950 | 7/2007 |

(Continued)

*Primary Examiner* — Huy Q Phan
*Assistant Examiner* — Giovanni Astacio-Oquendo
(74) *Attorney, Agent, or Firm* — Innovation Counsel LLP

(57) ABSTRACT

A display apparatus includes a display panel, a light source part, a light source driving part and a used time calculation part. The light source part includes a light source providing the display panel with lights. The light source driving part includes a boost part outputting a light source driving voltage and a light source driving chip controlling the boost part. The used time calculation part detects an initial drive time during which an initial driving voltage is supplied to the light source driving chip and a normal drive time during which a normal driving voltage is supplied to the light source driving chip, and calculates a used time of the light source by using the initial drive time and the normal drive time. Thus, a real used time of a light source may be provided to correctly estimate lifetime of a light source.

16 Claims, 5 Drawing Sheets

(56) References Cited

U.S. PATENT DOCUMENTS

| | | | | |
|---|---|---|---|---|
| 8,415,965 | B2 * | 4/2013 | Cho et al. | 324/760.01 |
| 2005/0162364 | A1 * | 7/2005 | Takahashi et al. | 345/94 |
| 2007/0216440 | A1 * | 9/2007 | Yamanaka et al. | 324/770 |
| 2009/0309498 | A1 * | 12/2009 | Park et al. | 315/32 |
| 2010/0020057 | A1 * | 1/2010 | Shin et al. | 345/211 |
| 2010/0123741 | A1 * | 5/2010 | Shin et al. | 345/690 |
| 2010/0290214 | A1 * | 11/2010 | Weng | 362/127 |

FOREIGN PATENT DOCUMENTS

| | | | |
|---|---|---|---|
| JP | 2008-122746 | * | 5/2008 |
| KR | 1020030080266 | A | 10/2003 |
| KR | 1020060063447 | A | 6/2006 |
| KR | 1020070067967 | A | 6/2007 |
| KR | 1020080057938 | A | 6/2008 |
| KR | 10-0865375 | B1 | 10/2008 |

* cited by examiner

FIG. 3

| DRIVING TIMES | INITIAL_TIME | 1ST NOR_TIME | 2ND NOR_TIME | ··· | iTH NOR_TIME | ··· | nTH NOR_TIME |
|---|---|---|---|---|---|---|---|
| 1 | 2009.09.01 08:30AM | 2009.09.01 08:31AM | 2009.09.01 08:33AM | ··· | 2009.09.01 10:30AM | ··· | |
| 2 | 2009.09.01 08:30PM | 2009.09.01 08:31PM | 2009.09.01 08:33PM | ··· | 2009.09.01 10:30PM | ··· | 2009.09.01 11:30PM |
| ⋮ | ⋮ | ⋮ | ⋮ | ⋱ | ⋮ | ⋱ | ⋮ |

METHOD OF CALCULATING A USED TIME OF A LIGHT SOURCE, METHOD OF DISPLAYING LIFETIME OF A LIGHT SOURCE USING THE METHOD AND DISPLAY APPARATUS FOR PERFORMING THE METHOD

PRIORITY STATEMENT

This application claims priority under 35 U.S.C. §119 to Korean Patent Application No. 2009-101645, filed on Oct. 26, 2009 in the Korean Intellectual Property Office (KIPO), the contents of which application are herein incorporated by reference in their entirety.

BACKGROUND

1. Field of the Invention

The present disclosure of invention relates to a method of calculating a used time of a light source, a method of displaying lifetime of a light source using the method, and a display apparatus for performing the method. More particularly, example embodiments of the present disclosure relate to a method of calculating a used time of a light source, which is capable of correctly estimating lifetime of a light source, a method of displaying lifetime of a light source using the method, and a display apparatus for performing the method.

2. Description of Related Technology

Generally, the liquid crystal display (LCD) types of flat panel display devices have various advantages, such as reduced thickness of the display panel, lighter weight, lower driving voltages and lower power consumption, etc., as compared to other types of display devices, where the latter include cathode ray tubes (CRTs), plasma display panels (PDPs), etc. As a result, the LCD devices are widely employed for various electronic devices such as desktop computer or TV monitors, laptop computers, cellular telephones, personal digital assistant (PDA) mobile devices, etc.

The typical LCD device includes an LCD panel that displays images by using an electronically-controlled light-transmission valve such as one based on orientation of liquid crystal molecules. The LCD device is basically a non-emissive type display device, so that the LCD device requires a light source such as a backlight device for example to supply a backside of the LCD panel with light.

As the LCD device has become more widely used, including perhaps in mission critical applications, a concern over the useful operational lifetime of the LCD device, and more particularly of its backlighting subunit has also increased. However, the typical LCD device mass production manufacturer can only provide an approximate estimate of lifetime of the LCD device to customers based on laboratory modeling because actual in-field use data is typically not available to the manufacturer.

According to one exemplary method of predicting lifetime of the LCD device, a brightness of lights generated from the backlight unit is measured by using a luminance sensor, and then the remaining lifetime is predicted on the basis of the measured luminance. More specifically, when the measured luminance is found to have decreased to below about 50% of the device's initial luminance, it is determined that the remaining useful lifetime of the backlight unit is finished. If linear degradation is assumed, then loss of half of the useful lifetime of the backlight unit is assumed when the measured luminance is found to have decreased to below about 75% of the device's initial luminance and so on.

Such methods of predicting the remaining useful lifetime of the backlight unit is performed based on an assumption that luminance is a good predictor of the expected lifetime of a light source element which is employed to the backlight unit, so that an approximate half lifetime or other aspect of the backlight unit may be predicted. However, it is difficult to accurately predict remaining useful lifetime of the backlight unit based on luminance alone because many factors can determine lifetime and the assumption of linearity or other trajectory for backlight luminance is not always trustworthy.

SUMMARY OF THE INVENTION

Example embodiments of the present invention provide a method of calculating a used time of a light source, which is capable of correctly estimating lifetime of a light source.

Example embodiments of the present invention also provide a method of displaying lifetime of a light source using the above-mentioned method.

Example embodiments of the present invention also provide a display apparatus that is suitable for performing the above-mentioned method of calculating a used time of a light source and the above-mentioned method of displaying lifetime of a light source.

According to one aspect of the present invention, there is provided a method of calculating a used time of a light source. In the method, an initial drive time during which an initial driving voltage is supplied to a light source driving chip which drives a light source is detected. Then, a normal drive time during which a normal driving voltage is supplied to the light source driving chip is detected. Then, a used time of the light source is calculated by using the initial drive time and the normal drive time.

In an exemplary embodiment, the used time of the light source may be calculated when an off voltage is supplied to the light source driving chip.

In an exemplary embodiment, the normal drive time may be detected in a predetermined time interval.

In an exemplary embodiment, the used time of the light source may be calculated by subtracting the initial drive time from a normal drive time that is lastly detected.

In an exemplary embodiment, the normal drive times detected in the predetermined time interval may be stored in a memory. The used time of the light source may be calculated by using difference values between adjacent normal drive times that are stored in the memory.

In an exemplary embodiment, the used time of the light source may be stored in a memory.

In an exemplary embodiment, an accumulated used time may be calculated by adding the used times of the light source in accordance with a driving of the light source which are stored in the memory. Then, an estimated used time of the light source may be calculated by subtracting the accumulated used time from a usable time of a light source which is predetermined.

According to another aspect of the present invention, there is provided a method of displaying lifetime of a light source. In the method, an initial drive time during which an initial driving voltage is supplied to a light source driving chip which drives a light source is detected. Then, a normal drive time during which a normal driving voltage is supplied to the light source driving chip is detected. Then, a used time of the light source is calculated by using the initial drive time and the normal drive time. Then, an accumulated used time and an estimated used time of the light source are calculated based on a used time of the light source and a usable time of a light source which is predetermined. Then, the accumulated used time and the estimated used time of the light source are displayed.

In an exemplary embodiment, the accumulated used time may be calculated by adding the used times of the light source which are stored in the memory to calculate the accumulated used time. The estimated used time may be calculated by subtracting the accumulated used time from a usable time of a light source which is predetermined to calculate an estimated used time of the light source.

According to another aspect of the present invention, a display apparatus includes a display panel, a light source part, a light source driving part and a used time calculation part. The display panel displays an image. The light source part includes a light source providing the display panel with lights. The light source driving part includes a boost part outputting a light source driving voltage for driving the light source and a light source driving chip controlling the boost part. The used time calculation part detects an initial drive time during which an initial driving voltage is supplied to the light source driving chip and a normal drive time during which a normal driving voltage is supplied to the light source driving chip, and calculates a used time of the light source by using the initial drive time and the normal drive time.

In an exemplary embodiment, the used time calculation part may include a voltage sensing part, a control part, a calculation part and a memory. The voltage sensing part senses a voltage applied to the power terminal. The control part detects the initial drive time and the normal drive time based on a voltage sensed by the voltage sensing part. The calculation part calculates a used time of the light source by using the initial drive time and the normal drive time. The memory stores the used times of the light source in accordance with a driving of the light source.

In an exemplary embodiment, the calculation part may calculate the used time of the light source when an off voltage is supplied to the light source driving chip.

In an exemplary embodiment, the control part may detect the normal drive time in a predetermined time interval.

In an exemplary embodiment, the calculation part may calculate a difference between a normal drive time that is lastly detected and the initial drive time to calculate the used time of the light source.

In an exemplary embodiment, the memory may store the normal drive times detected in the predetermined time interval, and the calculation part may calculate the used time of the light source by using difference values between adjacent normal drive times that are stored in the memory.

In an exemplary embodiment, the calculation part may calculate an accumulated used time of the light source by adding the used times of the light source that are stored in the memory, and may calculate an estimated used time of the light source by using the accumulated used time.

In an exemplary embodiment, the control part may display the accumulated used time and the estimated used time on the display panel in response to a lifetime information request signal.

According to some example embodiments of the present invention, a real used time of a light source is provided to correctly estimate lifetime of a light source, so that customer satisfaction and reliability of manufactured products may be improved.

BRIEF DESCRIPTION OF THE DRAWINGS

The above and other features and advantages of the present disclosure of invention will become more apparent by describing in detailed example embodiments in accordance thereof and with reference to the accompanying drawings, in which:

FIG. 3 is a schematic diagram illustrating a possible look-up table data structure that may be stored in the memory of FIG. 2;

DETAILED DESCRIPTION

Figure 1:
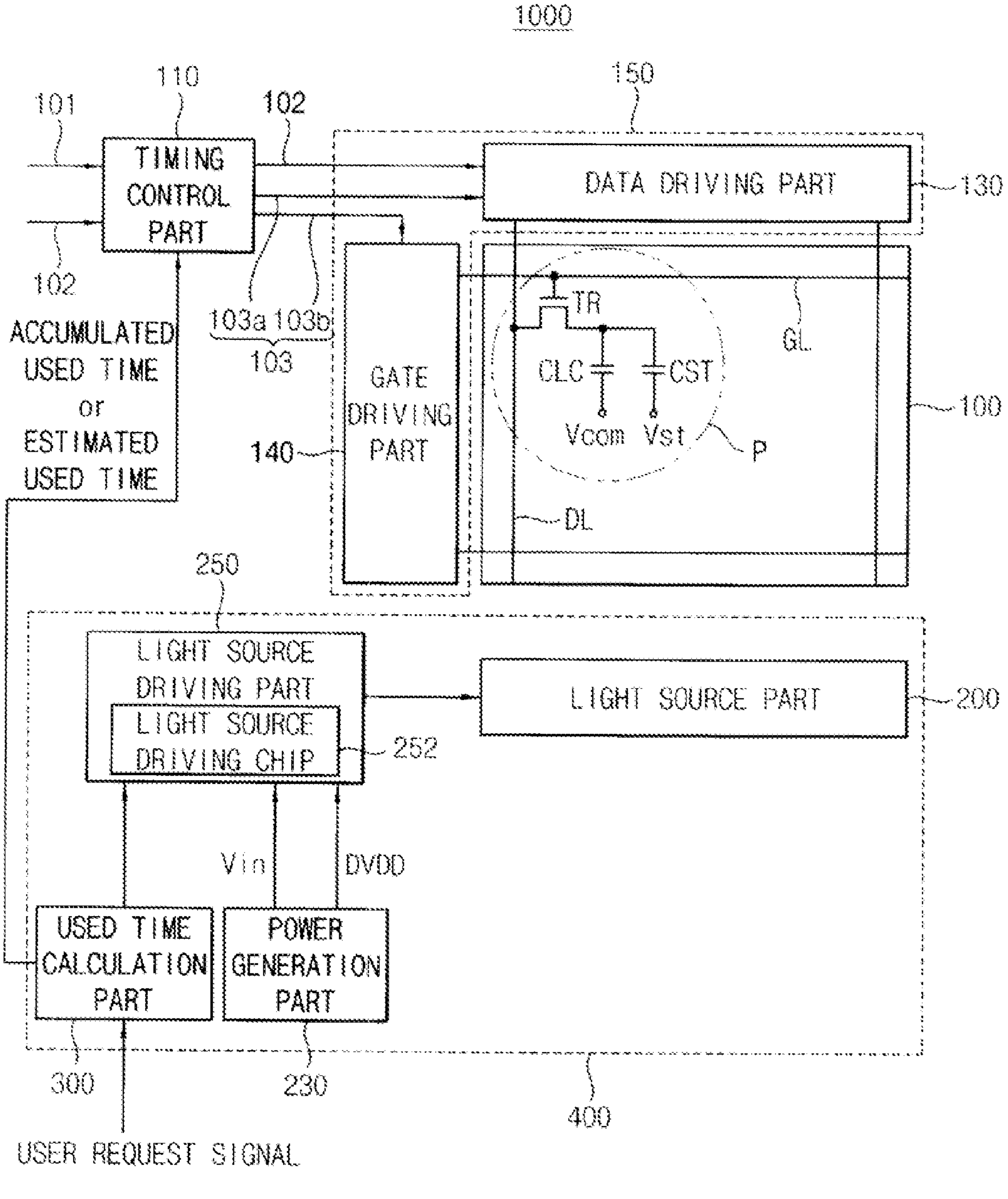
FIG. 1 is a block diagram schematically illustrating a display apparatus according to an exemplary embodiment.

The present disclosure of invention is described more fully hereinafter with reference to the accompanying drawings, in which example embodiments are shown. The present teachings may, however, be embodied in many different forms and should not be construed as limited to the example embodiments set forth herein. Rather, these example embodiments are provided so that this disclosure will be thorough and complete, and will fully convey the scope of the present teachings to those skilled in the pertinent art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present teachings. As used herein, the singular forms “a,” “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

Example embodiments in accordance with the disclosure are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments should not be construed as limiting the teachings to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present teachings.

Unless otherwise defined, all terms (including technical and scientific terms) used herein have the same meaning as commonly understood by one of ordinary skill in the art to which the claimed invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments in accordance with the disclosure will be explained in detail with reference to the accompanying drawings.

FIG. 1 is a block diagram schematically illustrating a display apparatus according to an exemplary embodiment.

Referring to FIG. 1, the display apparatus 1000 includes a display panel 100 (e.g., LCD panel), a timing control part 110, a panel driving part 150 and a light source unit 400.

The display panel 100 includes a plurality of gate lines GL, a plurality of data lines DL and a plurality of pixel units P. The data lines DL may cross with the gate lines GL. The pixel unit P is electrically connected to the gate line GL and the data line DL. The pixel unit P displays an image in response to a gate signal and a data signal that are provided through the gate line GL and the data line DL, respectively. Each of the pixel units P includes a switching element TR, a liquid crystal capacitor CLC and a storage capacitor CST. The switching element TR is electrically connected to the gate line GL and the data line DL. The liquid crystal capacitor CLC and the storage capacitor CST are electrically connected to the switching element TR. The liquid crystal capacitor CLC includes a first terminal electrically connected to the pixel electrode PE that is connected to a drain electrode of the switching element TR, and a second terminal electrically connected to a common electrode that receives a common voltage Vcom. The storage capacitor CST includes a first terminal electrically connected to the pixel electrode PE that is connected to the drain electrode of the switching element TR, and a second terminal electrically connected to a storage line that receives a storage voltage Vst. The display panel 100 may include a display substrate, an opposite substrate and a liquid crystal layer interposed between the display substrate and the opposite substrate.

The timing control part 110 receives a control signal 101 and an image signal 102 from an external device (not shown). The control signal 101 may include a main clock signal MCLK, a vertical synchronizing signal VSYNC, a horizontal synchronizing signal HSYNC, a data enable signal DE, etc. The timing control part 110 generates a panel control signal 103 that controls a driving timing of the panel driving part 150 by using the control signal 101. Although not explicitly shown, in some embodiments, the timing control part 110 also outputs one or more backlight control signals for controlling various aspects of operation of the backlighting unit 400, for example for providing dynamic backlight dimming for selected parts of the panel area. More specifically, each of several backlighting blocks might be driven at 75% or 50% or 25% or 0% duty cycle rather than always at 100% duty cycle.

The panel driving part 150 drives the display panel 100 in accordance with a control of the timing control part 110. The panel driving part 150 includes a data driving part 130 and a gate driving part 140. The panel control signal 103 may include a first control signal **103*a* for controlling a driving timing of the data driving part 130 and a second control signal 103*b* for controlling a driving timing of the gate driving part 140. The first control signal 103*a* may include a clock signal and a horizontal start signal, and the second control signal 103*b*** may include a vertical start signal.

The data driving part 130 generates a plurality of data signals by using the first control signal **103*a* and the image signal 102 provided from the timing control part 110**, and provides the data lines DL with the data signals.

The gate driving part 140 generates a plurality of gate signals that activate the gate lines GL by using the second control signal **103*b* provided from the timing control part 110, and provides the gate lines GL with the gate signals. For example, the gate driving part 140** may sequentially provide the gate signals to the gate lines GL.

The light source apparatus 400 includes a light source part 200, a power generation part 230, a light source driving part 250 and a used time calculation part 300. The power generation part 230 may be located elsewhere and need not be included inside the light source apparatus 400. For example, in some embodiments, various voltages (e.g., Vin, DVDD, VGon, VGoff, etc.) produced by the power generation part 230 may be used by other parts of the display apparatus 1000. In one embodiment, the power generation part 230 includes a DC-to-DC voltage converter 233 and it takes a variable amount of time for the DC/DC voltage converter 233 to power up into steady state mode (normal mode) after an external power source Vext is turned on.

The light source part 200 includes a plurality of light sources. The light source may be point light sources such as light-emitting diodes (LEDs) or other types of light sources having limited operational life times. The LED type of light source may include a red LED emitting a red light, a green LED emitting a green light and a blue LED emitting a blue light. Expected remaining lifetimes of these various types of semiconductor light sources may be a function of, among other factors, total electrical power consumed by the semiconductor light source since its initial date of manufacture and the temperatures at which the semiconductor light source operated under while consuming one power level or another.

As mentioned, the power generation part 230 generates various driving voltages including Vin and DVDD where the latter may be used for driving the light source driving part 250. In the case where the power generation part 230 includes a DC/DC voltage converter 233 or other switched device, powering up into steady state mode (normal mode) may consume a variable amount of time based on external conditions.

The light source driving part 250 includes a light source driving chip 252 that generates a driving signal for driving the light source part 200.

The used time calculation part 300 detects an initial drive time when an initial driving voltage is supplied to the light source driving chip 252 and a normal drive time when the normal driving voltage is supplied to the light source driving chop 252, and calculates a used time of the light source by using the initial drive time and the normal drive time.

Figure 2:
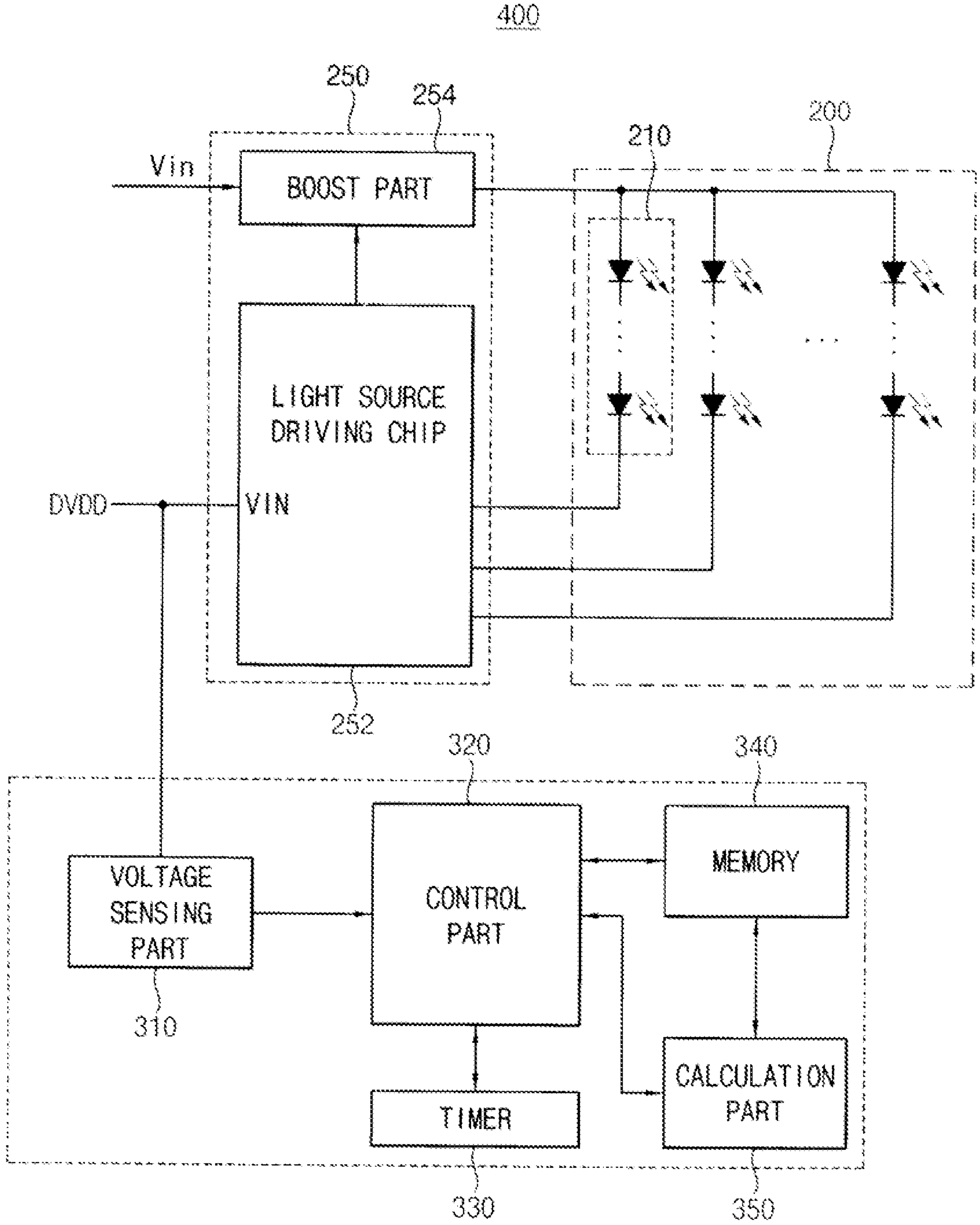
FIG. 2 is a block diagram illustrating a light source apparatus of FIG. 1 and a data structure stored in a nonvolatile memory part of the apparatus.

FIG. 2 is a block diagram illustrating in more detail, one embodiment 400 of the light source apparatus of FIG. 1.

Referring to FIGS. 1 and 2, the light source apparatus 400 includes a light source part 200, a light source driving part 250 and a used time calculation part 300.

The light source part 200 may include a plurality of light-emitting strings 210. The light-emitting strings 210 include a plurality of light-emitting diodes that are connected in a serial type. Current drawn by respective ones of these light-emitting strings 210 and the corresponding voltage applied across each of them may be controlled by and monitored by the light source driving part 250.

The light source driving part 250 includes a light source driving chip 252 and a boost part 254.

The light source driving chip 252 includes a power terminal VIN connected to the power generation part 230 to receive a digital driving voltage DVDD. The light source driving chip 252 controls a driving of the boost part 254.

The boost part 254 boosts the input voltage Vin provided from the power generation part 230 in accordance with a control of the light source driving chip 252 to generate a string driving voltage Vd for driving the light-emitting strings 210. The boost part 254 includes a first terminal connected to the power generation part 230 to receive the input voltage Vin and a second terminal connected to the light-emitting strings 210. A first terminal of the light-emitting string 210 is connected to the second terminal of the boost part 254, and a second terminal of the light-emitting string 210 is connected to the light source driving chip 252.

The used time calculation part 300 includes a voltage sensing part 310, a control part 320, a timer 330, a memory 340 and a calculation part 350.

The voltage sensing part 310 is connected to the power terminal VIN of the light source driving chip 252 to sense a level of the digital driving voltage DVDD applied to the power terminal VIN. The voltage sensing part 310 provides the control part 320 with a level of the digital driving voltage DVDD.

The control part 320 may compare a level of the digital driving voltage DVDD sensed by the voltage sensing part 310 with a reference level to determine whether the initial driving voltage is supplied to the power terminal VIN or the normal driving voltage is supplied to the power terminal VIN. For example, the control part 320 determines that the initial driving voltage is supplied to the power terminal VIN when the level of the digital driving voltage DVDD is substantially equal to the reference level. Alternatively, when the digital driving voltage DVDD is greater than the reference level, the control part 320 determines that the normal driving voltage is supplied to the power terminal VIN. In this case, the level of the normal driving voltage may be about 3.3 V to about 5 V. The initial driving voltage is a voltage for enabling the light source driving chip 252 to have a level corresponding to about 90% of the normal driving voltage level.

When it is determined that the initial driving voltage is supplied to the power terminal VIN, the control part 320 detects the initial drive time of the initial driving voltage by using the timer 330. When it is determined that the normal driving voltage is supplied to the power terminal VIN after the initial driving voltage is received, the control part 320 detects the normal drive time of the normal driving voltage by using the timer 330.

The memory 340 stores the initial drive time and the normal drive times. For example, the memory 340 stores the initial drive time and the normal drive times as in a form of a look-up table (LUT).

FIG. 3 is a schematic diagram illustrating a possible look-up table data structure that may be stored in the memory of FIG. 2

Referring to FIG. 3, an LUT stored in the memory 340 stores the initial drive time (initial_time) and the normal drive times (1st Nor-time to n-th Nor-time) every drive time. In FIG. 3, it is described that the normal drive times are stored every two minutes. However, it is not limited to that exemplary embodiment. Moreover, in FIG. 3, the initial and normal drive times are recorded as in hours and minutes. Alternatively, the initial and normal drive times may be recorded as in seconds.

The calculation part 350 calculates a used time of the light source based on the initial drive time stored in the memory 340 and the normal drive time in accordance with a control of the control part 320. For example, the calculation part 350 adds difference values between adjacent normal drive times stored in the memory 340 to calculate the used time of the light source. For example, the calculation part 350 obtains difference values between adjacent normal drive times from an initial drive time (initial_time) stored in accordance with a first light source driving to an i-th normal drive time (ith Nor_time), and adds the obtained difference values to calculate a used time of the light source in accordance with the first light source driving. The difference value between the initial drive time (initial_time) and a first normal drive time (1st Nor_time) is one minute, and the difference value between the first normal drive time (1st Nor_time) and a second normal drive time (2nd Nor_time) is two minutes. As described above, the difference values between adjacent normal drive times from an initial drive time to an i-th normal drive time are obtained, and then the obtained difference values are added to calculate a used time of the light source in accordance with the first light source driving.

The calculation part 350 subtracts the initial drive time from the normal drive time lastly stored of the normal drive times to calculate a used time of the light source. For example, a normal drive time (ith Nor_time) that is lastly stored in response to a first light source driving as shown in FIG. 3 is ten thirty (AM 10:30), and an initial drive time (initial_time) is eight thirty (AM 8:30). Thus, the used time of the light source in accordance with the first light source driving is two hours. The calculation part 350 provides the memory 340 with the used time of the light source that is calculated, so that the used time of the light source is stored in the memory 340. For one example, the used time of the light source may be divided by the normal drive times to be stored in the memory 340. For another example, the used time of the light source may be divided and stored according to a driving date of the light source in the memory 340.

The calculation part 350 calculates an accumulated used time of the light source and an estimated used time based on a used time of a light source which is stored in the memory 340 and a usable time of a light source which is predetermined. The accumulated used time may be calculated by adding the used time of the light source by the normal drive times. The estimated used time may be calculated by subtracting the accumulated used time from the usable time of the light source which is predetermined.

Figure 4:
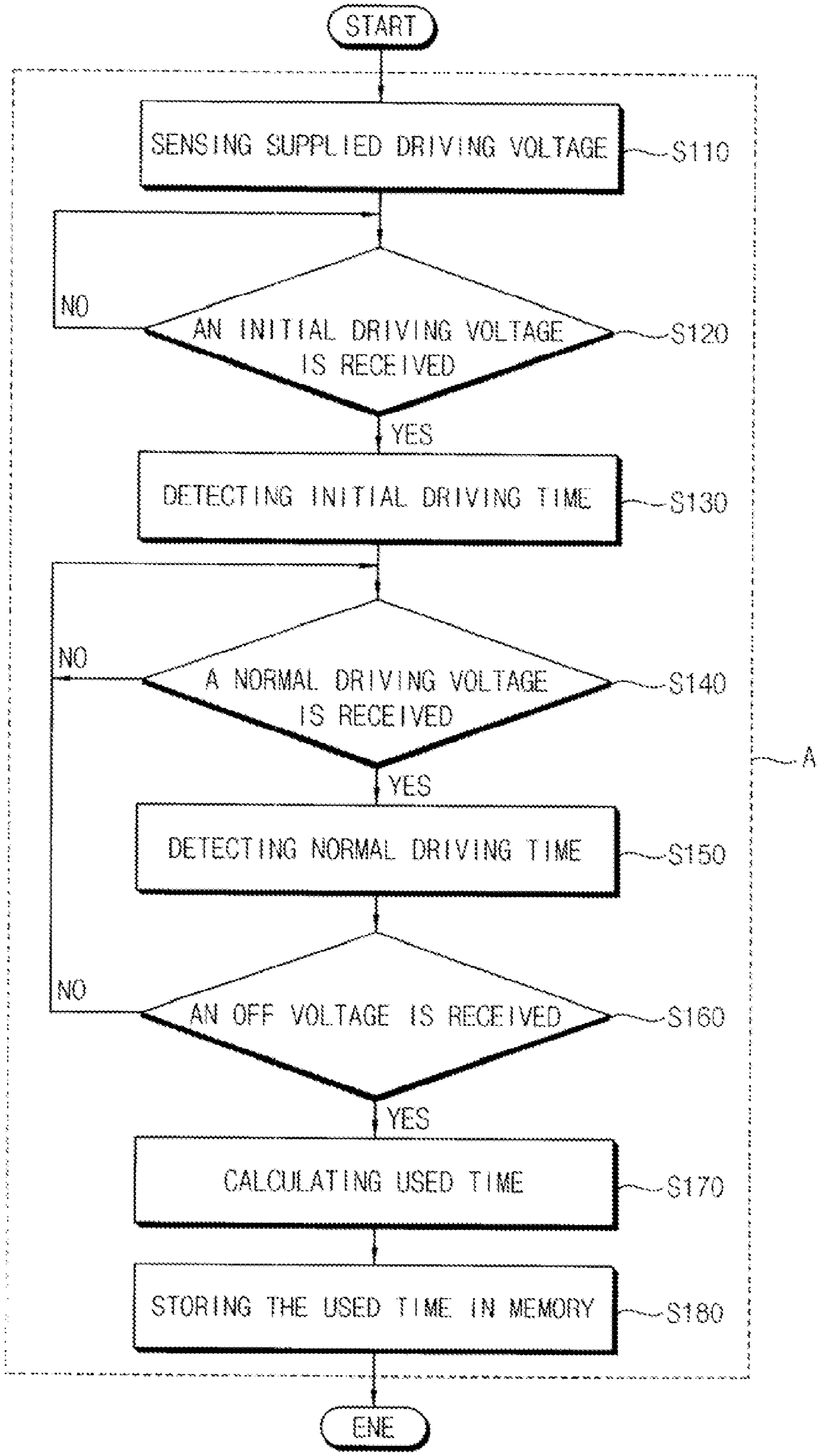
FIG. 4 is a flowchart showing a method of calculating a used time of a light source part of FIG. 2.

FIG. 4 is a flowchart showing a method of calculating a used time of a light source part of FIG. 2.

Referring to FIGS. 2 and 4, the voltage sensing part 310 senses a level of the digital driving voltage DVDD applied to the power terminal VIN of the light source driving chip 252 to provide the control part 320 with the detected level of the digital driving voltage DVDD (step S110).

The control part 320 compares the detected level of the digital driving voltage DVDD with a reference level to determine whether or not the initial driving voltage is supplied to the power terminal VIN (step S120). For example, when the level of the digital driving voltage DVDD is substantially equal to the reference level, the control part 320 may determine that the initial driving voltage for enabling the light source driving chip 252 is supplied to the power terminal VIN.

When the initial driving voltage is supplied to the power terminal VIN, the control part 320 detects the initial drive time of the initial driving voltage by using the timer 330 (step S130). The control part 320 controls the memory 340 such that the normal drive time is stored in the memory 340.

The control part 320 compares a level of the digital driving voltage DVDD sensed by the voltage sensing part 310 with a reference level to determine whether or not the normal driving voltage is supplied to the power terminal VIN. For example, when the level of the digital driving voltage DVDD is greater than the reference level, the control part 320 may determine that the normal driving voltage is supplied to the power terminal VIN.

When it is determined that the normal driving voltage is supplied to the power terminal VIN, the control part 320 detects the normal drive time during which the normal driving voltage is received, by using the timer 330 (step S150). The control part 320 controls that memory 340 to store the normal drive time.

The control part 320 determines whether or not an off voltage is supplied to the power terminal VIN (step S160). For example, the control part 320 compares a level of the digital driving voltage DVDD sensed by the voltage sensing part 310 with a reference level, and then determines that the light source off voltage is supplied to the power terminal VIN when the level of the digital driving voltage DVDD is smaller than the reference level.

In step S160, when it is determined that the off voltage is not supplied to the power terminal VIN, the control part 320 determines whether or not the normal driving voltage is supplied to feeding back to step S140 (or to S150 in an alternate embodiment). When it is determined that the normal driving voltage is received, the control part 320 may continuously perform an operation which detects the normal drive time by using the timer 330 (step S150). The control part 320 controls the memory 340 to store the normal drive time detected by the predetermined interval.

In step S160, when it is determined that the off voltage is supplied to the power terminal VIN, the control part 320 controls the calculation part 350 to calculate the used time of the light source.

The calculation part 350 calculates the used time of the light source based on the initial drive time stored in the memory 340 and the normal drive time in accordance with a control of the control part 320 (step S170). For example, the control part 320 obtains difference values between adjacent normal drive times stored in the memory 340, and then calculates the used time of the light source by adding the obtained difference values. Moreover, the control part 320 subtracts the initial drive time from a normal drive time that is lastly stored to calculate a used time of the light source.

The calculation part 350 provides the memory 340 with the used time of the light source which is calculated, so that the memory 340 stores the used time of the light source (step S180).

Figure 5:
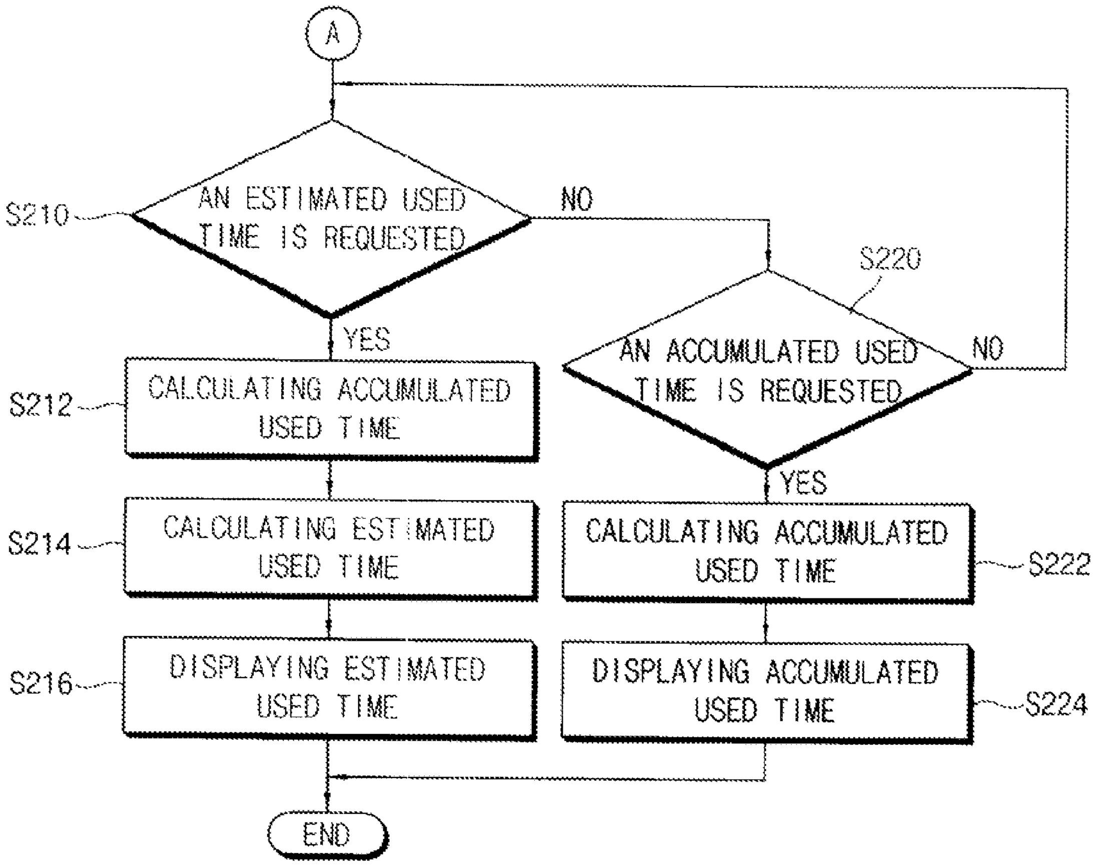
FIG. 5 is a flowchart showing a method of displaying lifetime of a light source part of FIG. 1.

FIG. 5 is a flowchart showing a method of displaying lifetime of a light source part of FIG. 1.

In this embodiment, a method in which the used time of a light source according to a driving of a light source is calculated to be stored in the memory, before a lifetime information request signal of a light source part is inputted by user, is substantially the same as the method of calculating a used time of a light source which is described with reference to FIG. 4. Thus, a detailed description thereof will be omitted Referring to FIGS. 1, 2 and 5, when a user request signal is a signal requesting an estimated used time of the light source (step S210), the control part 320 controls the calculation part 350 so that the calculation part 350 calculates an accumulated used time of the light source.

The calculation part 350 adds used times of the light source by normal drive times stored in the memory 340 in accordance with a control of the control part 320 to calculate an accumulated used time of the light source (step S212).

Then, the calculation part 350 subtracts the accumulated used time from a usable time of the light source that is predetermined to calculate an estimated time (step S214).

When the calculation of the estimated used time of the light source is finished, the control part 320 provides the timing control part 110 with the estimated used time which is calculated by the calculation part 350. The timing control part 110 provides the panel driving part 150 with the estimated used time. The panel driving part 150 displays the estimated used time on the display panel 100 (step S216).

When the user request signal is a signal requesting an accumulated used time of the light source (step S220), the control part 320 controls the calculation part 350 so that the calculation part 350 calculates an accumulated used time of the light source.

The calculation part 350 adds used times of the light source by normal drive times stored in the memory 340 in accordance with a control of the control part 320 to calculate an accumulated used time of the light source (step S222).

When the calculation of the accumulated used time is finished, the control part 320 provides the timing control part 110 with the accumulated used time which is calculated by the calculation part 350. The timing control part 110 provides the panel driving part 150 with the accumulated used time. The panel driving part 150 displays the accumulated used time on the display panel 100 (step S224).

In the previous embodiment, it was described that the accumulated used time is displayed on the display panel 100 or the estimated used time is displayed on the display panel 100 in response to a request of a user. Alternatively, the accumulated used time and the estimated used time may be simultaneously displayed on the display panel 100 in response to a request of a user.

As described above, according to an exemplary embodiment of the present invention, a real used time of a light source is measured in response to a lifetime information request signal of a light source, so that customer satisfaction and reliability of manufactured products may be improved.

The foregoing is illustrative of the present teachings and is not to be construed as limiting thereof. Although a few example embodiments have been described, those skilled in the pertinent art will readily appreciate in light of the foregoing that many modifications are possible in the example embodiments without materially departing from the novel teachings provided herein. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. A method of calculating a used time of a light source, the method comprising:

sensing a level of a driving voltage applied to a power terminal of a light source driving chip;

detecting an initial drive time when the level of the driving voltage is substantially equal to a reference level to start driving the light source;

detecting a normal drive time when the level of the driving voltage is greater than the reference level to drive the light source; and calculating a used time of the light source by using the initial drive time and the normal drive time, wherein the used time of the light source is calculated when an off voltage is supplied to the light source driving chip, and wherein the off voltage is less than the reference level.

2. The method of claim 1, wherein detecting the normal drive time comprises detecting the normal drive time in a predetermined time interval.

3. The method of claim 2, wherein calculating the used time of the light source comprises subtracting the initial drive time from a normal drive time that is lastly detected.

4. The method of claim 2, further comprising:

storing the normal times detected in the predetermined time interval in a memory, wherein the used time of the light source is calculated using difference values between adjacent normal drive times that are stored in the memory.

5. The method of claim 1, further comprising:

storing the used time of the light source in a memory.

6. The method of claim 5, further comprising:

calculating an accumulated used time by adding the used times of the light source in accordance with a driving of the light source which are stored in the memory; and calculating an estimated used time of the light source by subtracting the accumulated used time from a usable time of a light source which is predetermined.

7. A method of displaying lifetime of a light source, the method comprising:

sensing a level of a driving voltage applied to a power terminal of a light source driving chip;

detecting an initial drive time when the level of the driving voltage is substantially equal to a reference level to start driving the light source;

detecting a normal drive time when the level of the driving voltage is greater than the reference level to drive the light source;

calculating a used time of the light source by using the initial drive time and the normal drive time;

calculating an accumulated used time and an estimated used time of the light source based on a used time of the light source and a usable time of a light source which is predetermined; and displaying the accumulated used time and the estimated used time of the light source, wherein the used time of the light source is calculated when an off voltage is supplied to the light source driving chip, wherein the off voltage is less than the reference level.

8. The method of claim 7, wherein the accumulated used time is calculated by adding the used times of the light source which are stored in the memory.

9. The method of claim 7, wherein the estimated used time is calculated by subtracting the accumulated used time from a usable time of a light source which is predetermined.

10. A display apparatus comprising:

a display panel displaying an image;

a light source part comprising a light source providing the display panel with lights;

a light source driving part comprising a boost part outputting a light source driving voltage for driving the light source and a light source driving chip controlling the boost part; and a used time calculation part configured for sensing a level of a driving voltage applied to a power terminal of the light source driving chip, and for detecting an initial drive time when the level of the driving voltage is substantially equal to a reference level to start driving the light source and a normal drive time when the level of the driving voltage is greater than the reference level to drive the light source, and calculating a used time of the light source by using the initial drive time and the normal drive time, wherein the used time calculation part calculates the used time of the light source when an off voltage is supplied to the light source driving chip, wherein the off voltage is less than the reference level.

11. The display apparatus of claim 10, wherein the used time calculation part comprises:

a voltage sensing part sensing the driving voltage applied to the power terminal;

a control part detecting the initial drive time and the normal drive time based on the driving voltage sensed at the voltage sensing part;

a calculation part calculating a used time of the light source by using the initial drive time and the normal drive time; and a memory storing the used times of the light source in accordance with a driving of the light source.

12. The display apparatus of claim 11, wherein the control part detects the normal drive time in a predetermined time interval.

13. The display apparatus of claim 12, wherein the calculation part calculates a difference between a normal drive time that is lastly detected and the initial drive time to calculate the used time of the light source.

14. The display apparatus of claim 12, wherein the memory stores the normal drive times detected in the predetermined time interval, and the calculation part calculates the used time of the light source by using difference values between adjacent normal drive times that are stored in the memory.

15. The display apparatus of claim 11, wherein the calculation part calculates an accumulated used time of the light source by adding the used times of the light source that are stored in the memory, and calculates an estimated used time of the light source by using the accumulated used time.

16. The display apparatus of claim 15, wherein the control part displays the accumulated used time and the estimated used time on the display panel in response to a lifetime information request signal.

* * * * *